United States Patent
Malhammar

(10) Patent No.: US 6,622,782 B2
(45) Date of Patent: Sep. 23, 2003

(54) DEVICE FOR COOLING OF ELECTRONIC COMPONENTS

(75) Inventor: Ake Malhammar, Marseilles (FR)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 10/013,830

(22) Filed: Dec. 13, 2001

(65) Prior Publication Data

US 2002/0088605 A1 Jul. 11, 2002

Related U.S. Application Data

(63) Continuation of application No. PCT/SE00/01177, filed on Jun. 7, 2000.

(30) Foreign Application Priority Data

Jun. 14, 1999 (SE) ............................................. 9902230

(51) Int. Cl.⁷ .................................................. F28F 7/00
(52) U.S. Cl. .................... 165/46; 165/80.3; 165/185; 165/104.33; 257/719; 361/704
(58) Field of Search ............... 165/80.1–80.4, 165/185, 46, 104.33; 361/704, 708–710; 257/718, 719, 722

(56) References Cited

U.S. PATENT DOCUMENTS

| 3,586,102 | A | | 6/1971 | Gilles | |
|---|---|---|---|---|---|
| 4,279,294 | A | * | 7/1981 | Fitzpatrick et al. | 165/46 |
| 4,938,279 | A | | 7/1990 | Betker | |
| 5,150,274 | A | * | 9/1992 | Okada et al. | 165/185 |
| 5,245,508 | A | * | 9/1993 | Mizzi | 165/46 |
| 5,365,402 | A | | 11/1994 | Hatada et al. | |
| 5,485,671 | A | | 1/1996 | Larson et al. | |
| 5,640,303 | A | | 6/1997 | Hooley | |
| 6,116,331 | A | * | 9/2000 | Tustaniwskyj et al. | 165/80.4 |
| 6,154,363 | A | * | 11/2000 | Chang | 165/80.4 |
| 6,227,287 | B1 | * | 5/2001 | Tanaka et al. | 165/80.4 |

FOREIGN PATENT DOCUMENTS

| DE | 197 04 549 A1 | | 8/1997 | | |
|---|---|---|---|---|---|
| JP | 0099586 | * | 7/1980 | | 165/46 |
| JP | 0126098 | * | 5/1999 | | 165/46 |

OTHER PUBLICATIONS

Dunn et al., Water–Cooling Jacket, Apr. 1982, pp. 5945–5946, IBM Technical Disclosure Bulletin, vol. 24, No. 11B.*

Parsapour, Convection Cooling in small Terminals, Jul. 1981, p. 1222, IBM Technical Disclosure Bulletin, vol. 24, No. 2.*

* cited by examiner

Primary Examiner—Christopher Atkinson
(74) Attorney, Agent, or Firm—Nixon & Vanderhye P.C.

(57) ABSTRACT

On a fastening element for securing a thermal conducting bag filed with liquid comprising a frame a number individual resilient tongues are attached. Such an arrangement obtains that a pad or bag filled with liquid securely can be positioned in the frame at the same time as the individually resilient tongues maintains the flexible characteristics of the pad filled with liquid.

6 Claims, 3 Drawing Sheets

External view

DEVICE FOR COOLING OF ELECTRONIC COMPONENTS

This application is a continuation of application No. PCT/SE00/01177, filed Jun. 7, 2000, the entire content of which is hereby incorporated by reference in this application.

BACKGROUND OF THE INVENTION

Today a rapid miniaturization is taking place in electronics. Traditional methods of cooling and cooling devices no longer are able to provide the cooling required for correct operation of the electronics. Another consequence of this miniaturization is that the need for screening of components increase. Higher clock frequencies are used, which increases radiation.

In FIGS. 1a–1c a structure which can be used for obtaining proper cooling and proper screening is shown. As shown in FIG. 1a, the electronic components are located on different levels in a frame comprising cooling flanges. In this tower structure the components are contained in metal cassettes connected to the outer cooling flanges in the common frame. FIG. 1b is a cross section of such a cassette where the different electronic components 101 are shown.

In such a structure shown in FIG. 1a and FIG. 1b, the components are mainly cooled via thermal conduction in the circuit board. Thus, the components generating much thermal heat must be located close to the cassette edge as is shown in FIG. 1c.

One possibility to increase the freedom in location of the components is to thermally connect the upper sides of the components to the walls 113 of the metal cassette, as is shown in FIG. 2. In FIG. 2, which is similar to FIG. 1b, thermal contact elements 103 are located between the inner electronic components and the housing 113 of the cassette. Such a thermal connection can be achieved in a number of different ways. One way of obtaining such a thermal connection is by means of using a pad or bag filled with liquid. In for example U.S. Pat. Nos. 5,640,303 and 5,720,338 such pads filled with liquid are described in different embodiments.

However, there is a problem securing or fastening such thermal conducting pads filled with liquid. A pad filled with liquid provided to contact one or several electronic components in order to conduct away thermal heat can come out of its proper position. This is of course not desired since a large part of the cooling then is lost, and the component may be overheated.

SUMMARY

Its an object of the present invention to provide a fastening element for a thermally conducting pad filled with liquid which securely keeps the pad at the intended position without reducing the flexible characteristics of the pad.

This object and others are obtained by a fastening element comprising a frame on to which a number of individually resilient tongues are attached.

Such an arrangement achieves that a pad or bag filled with liquid securely can be fixed within the frame, while the individually resilient tongues achieves that the desired flexible characteristics of the pad filled with liquid are maintained.

BRIEF DESCRIPTION OF THE DRAWINGS

The present invention will now be described in more detail with reference to the accompanying drawings, in which.

DESCRIPTION OF PREFERRED EMBODIMENTS

Figure 1A:
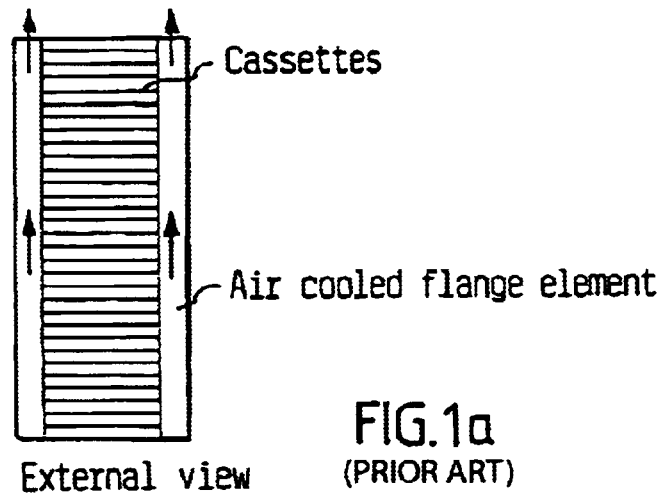
FIGS. 1a–1c illustrates the principle for locating electronics components in a so called tower structure.
Figure 1B:
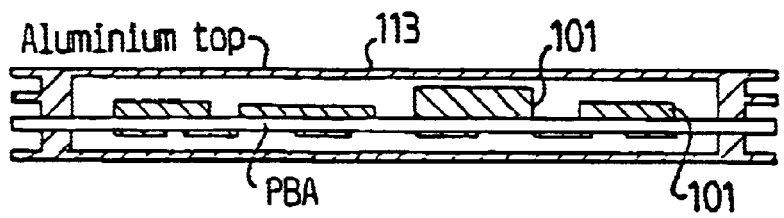
Figure 1C:
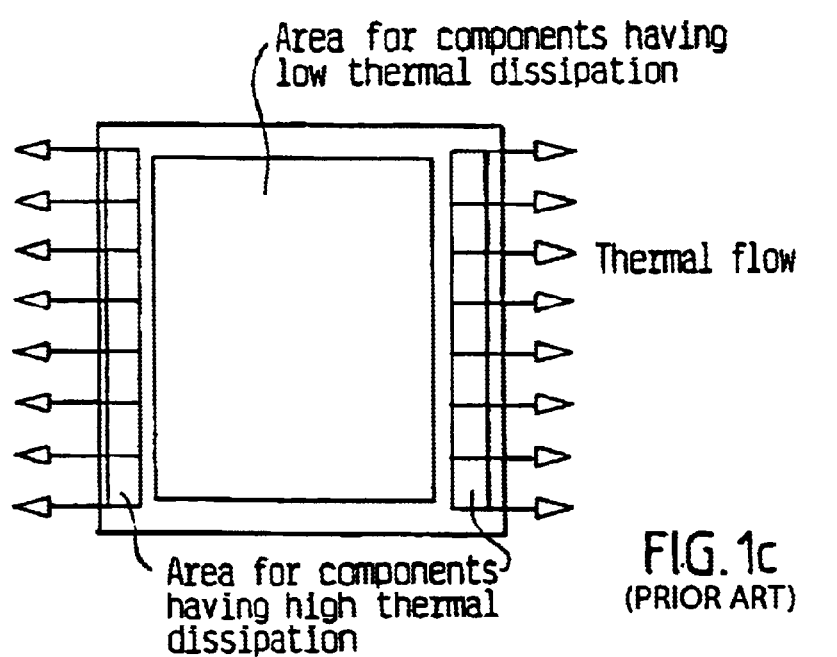
Figure 2:
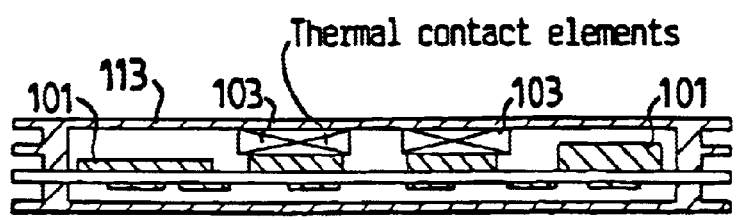
FIG. 2 is a view of an electronic structure similar to the view in FIG. 1b.
Figure 3:
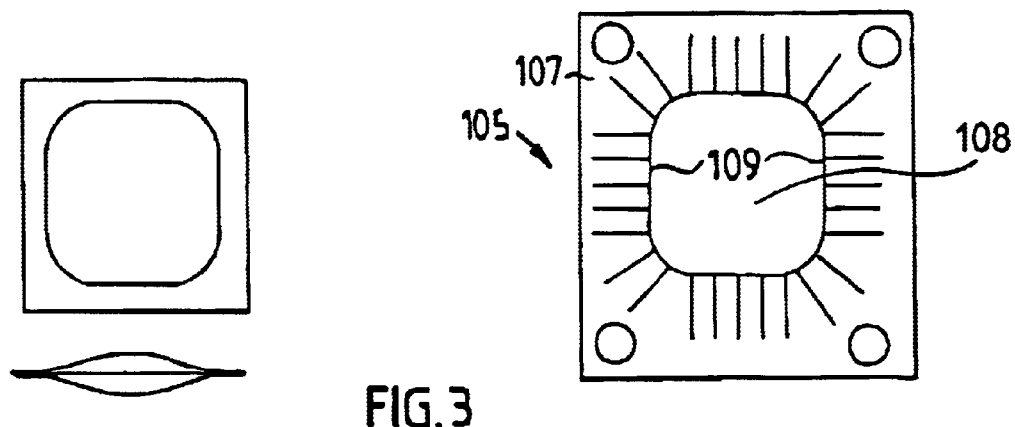
FIG. 3 shows a fastening element for a pad filled with liquid.

In FIG. 3, a fastening element 105 for a pad or bag filled with liquid is shown. The fastening element 105 comprise a frame 107 in which a number of tongues 109 are provided. In the embodiment shown in FIG. 3 the tongues project in towards the center of the frame 107 forming a central opening 108.

Figure 4:
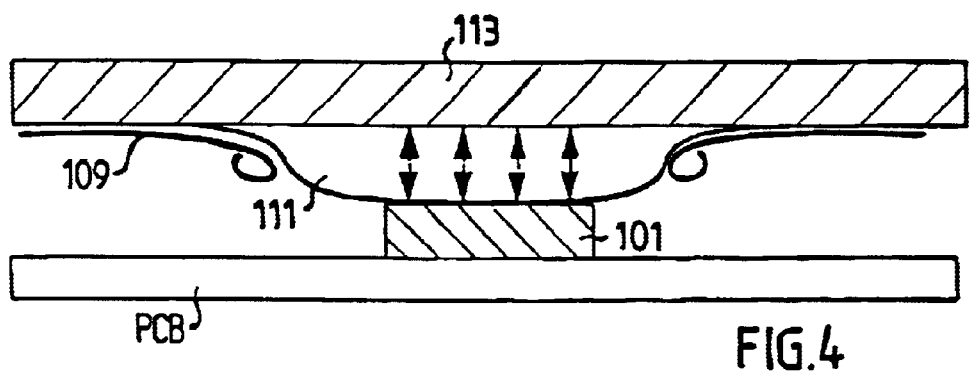
FIG. 4 shows a cross section of a pad filled with liquid attached to an electronic component.

The bag 111 filled with liquid is fastened to the wall 113 using a fastening element 105. The fastening element has multiple individually-resilient tongues projecting toward the center of the fastening element. The tongues also project toward the center of the bag filled with liquid when secured in the fastening element. Using a resilient force, the tongues press the contents of the bag towards the center of the bag. At the same time, the resilient tongues press the contents of the bag both upwards and downwards as shown by the doubled-headed avows in the FIG. 4. As a result, the bag presses against the component as well as the cool wall 113. When the contents of the bag is a material with good thermal conducting characteristics, an efficient cooling of the components is obtained.

The content in the bag can suitably be a material having good thermal conducting characteristics. For example, a fat, an oil, a wax or a paraffin like material can be used. The liquid in the bag can also be electrically conducting. Thus the bag can also contain particles of metal, which significantly increase the thermal conduction. The bag or pad itself can suitably be made of a metal film coated with a plastics material, such as an aluminium film.

Figure 5A:
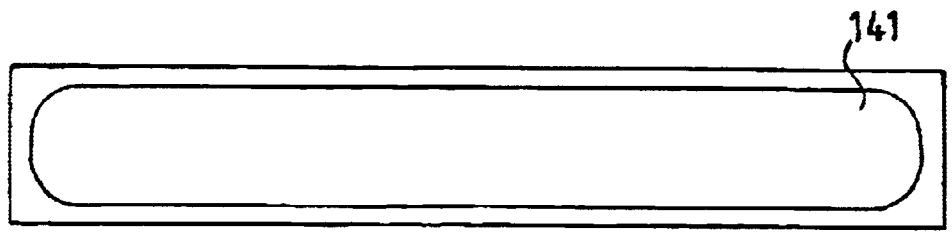
FIGS. 5a–5c shows a fastening element according to another embodiment.
Figure 5B:
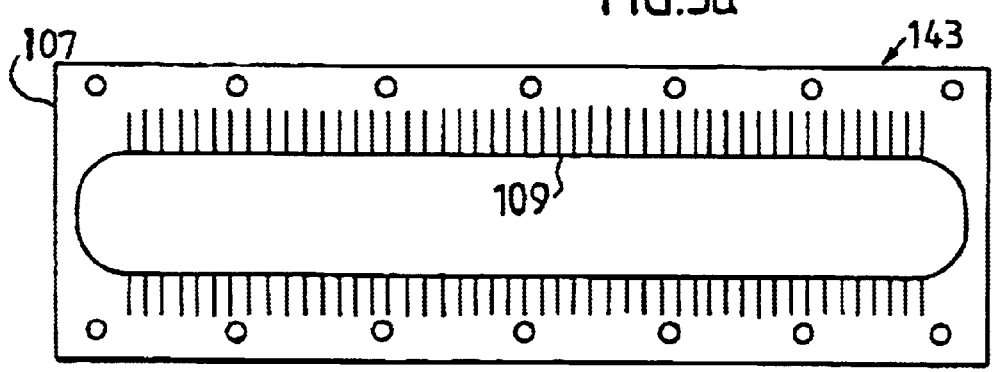
Figure 5C:
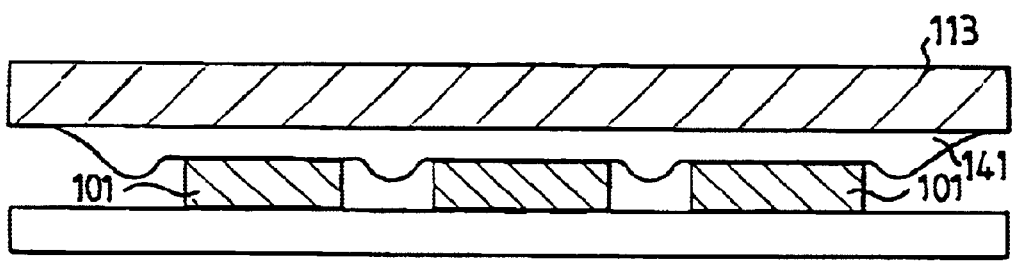

In FIGS. 5a–5c another embodiment of a fastening element with an associated bag filled with liquid is shown. The fastening element as shown in FIG. 5b is designed to fasten a bag filled with liquid provided to act as a thermal conducting element for several electrical components located in a line. In FIG. 5a, a bag 141 designed for cooling a number of electronic components located in line is shown. In FIG. 5b, a fastening element 143 which can be used for fastening the bag 41 shown in FIG. 5a is shown. The fastening element 143 in FIG. 5b comprises an elongated frame having a resilient tongues formed on it's long sides.

Since the bag 141 is provided for cooling a multitude of components located on a line, the fastening element 143 is designed to efficiently secure the elongated bag and, at the same time, even out differences in size of the electronic components and maintain pressure to the wall and to the electronic components.

In FIG. 5c a view from the side where the fastening element 143 is used for fastening a bag 141 for cooling of electronic components 101 located on a circuit board. The bag 141 secured in this way conducts thermal heat from the electronic component to a cooling wall, such as the cassette wall described above.

Even if the fasten element has been shown as formed in one single work piece, it is also possible to manufacture the fame and the tongues with different materials if this should turn out advantageous in some application. Furthermore, it is not necessary that the fastening element shaped as a closed structure. It is also possible to form a fastening device comprising a number of sub-elements which together form an entire fastening element. For example, the fastening element as shown in FIG. 5b could be formed by two different sub-elements, i.e., the two rows of tongues could be formed on two different sub-elements, which when they are fasten to a wall cooperates and forms an entire fastening element.

Using the fastening elements as described herein, a bag or pad filled with liquid can be securely positioned at the same time as the individually resilient tongues maintains desired flexible characteristics of the pad tilled with liquid.

What is claimed is:

1. A device for cooling of electronic components, comprising:
   a thermally conducting flexible pad with liquid for conducting thermal heat from the electronic components, and
   a fastening element for securing the position of the pad against a cooling wall including:
     a frame attachable to the wall, and
     a number of individually-resilient elongated tongues extending from the frame toward a central opening formed by the fastening element to contact the pad when positioned in the opening using a resilient force such that the liquid in the pad is pressed towards the center of the pad.

2. A cooling device according to claim 1, wherein the frame and the tongues are formed by one single work piece.

3. A cooling device according to claim 1, wherein the frame is elongated in order to receive a pad filled with liquid designed to cool a number of electronic components located in a line.

4. A device for cooling electronic components, comprising:
   a thermally-conducting, fluid-filled, flexible means for conducting thermal heat from the electronic components, and
   means for securing the position of the means for conducting against a cooling wall including:
     a frame means attachable to the wall, and
     resilient tongue means, including a plurality of individual elongated tines each tine extending from the frame means towards a central opening formed by the means for securing, for contacting the means for conducting when positioned in the opening using a resilient force such that the fluid in the means for conducting is pressed towards the center of the means for conducting.

5. A cooling device according to claim 4, wherein the frame means and the tongue means are formed by a single work piece.

6. A cooling device according to claim 4, wherein the frame means is elongated in order to receive the means for conducting configured to cool a number of electronic components located in a line.

* * * * *